(12) United States Patent
Bill et al.

(10) Patent No.: US 7,145,824 B2
(45) Date of Patent: Dec. 5, 2006

(54) TEMPERATURE COMPENSATION OF THIN FILM DIODE VOLTAGE THRESHOLD IN MEMORY SENSING CIRCUIT

(75) Inventors: Colin S. Bill, Cupertino, CA (US); Wei Daisy Cai, Fremont, CA (US)

(73) Assignee: Spansion LLC, Sunnyvale, CA (US)

( * ) Notice: Subject to any disclaimer, the term of this patent is extended or adjusted under 35 U.S.C. 154(b) by 98 days.

(21) Appl. No.: 11/086,884

(22) Filed: Mar. 22, 2005

(65) Prior Publication Data
US 2006/0215439 A1  Sep. 28, 2006

(51) Int. Cl.
*G11C 7/04* (2006.01)

(52) U.S. Cl. .............. 365/212; 365/211; 365/148; 365/163; 977/943

(58) Field of Classification Search .......... 365/212
See application file for complete search history.

(56) References Cited

U.S. PATENT DOCUMENTS

| | | | |
|---|---|---|---|
| 5,206,525 A * | 4/1993 | Yamamoto et al. ......... 257/40 |
| 5,793,697 A * | 8/1998 | Scheuerlein .......... 365/230.07 |
| 5,818,749 A * | 10/1998 | Harshfield .............. 365/105 |
| 6,097,627 A * | 8/2000 | Peterson et al. ........... 365/175 |
| 6,608,790 B1 * | 8/2003 | Tran et al. ................. 365/211 |
| 6,656,763 B1 | 12/2003 | Oglesby et al. |
| 6,686,263 B1 | 2/2004 | Lopatin et al. |
| 6,746,971 B1 | 6/2004 | Ngo et al. |
| 6,753,247 B1 | 6/2004 | Okoroanyanwu et al. |
| 6,768,157 B1 | 7/2004 | Krieger et al. |
| 6,770,905 B1 | 8/2004 | Buynoski et al. |
| 6,773,954 B1 | 8/2004 | Subramanian et al. |
| 6,781,868 B1 | 8/2004 | Bulovic et al. |
| 6,787,458 B1 | 9/2004 | Tripsas et al. |
| 6,803,267 B1 | 10/2004 | Subramanian et al. |
| 6,825,060 B1 | 11/2004 | Lyons et al. |
| 6,834,010 B1 * | 12/2004 | Qi et al. ................ 365/185.05 |
| 6,852,586 B1 | 2/2005 | Buynoski et al. |
| 6,858,481 B1 | 2/2005 | Krieger et al. |
| 6,864,522 B1 | 3/2005 | Krieger et al. |
| 6,868,025 B1 * | 3/2005 | Hsu ........................ 365/211 |

(Continued)

FOREIGN PATENT DOCUMENTS

EP    1460637    9/2004

(Continued)

OTHER PUBLICATIONS

International Search Report for PCT/US06/010364 dated Sep. 11, 2006.

*Primary Examiner*—Son L. Mai
(74) *Attorney, Agent, or Firm*—Amin & Turocy, LLP

(57) ABSTRACT

Systems and methodologies are provided for temperature compensation of thin film diode voltage levels in memory sensing circuits. The subject invention includes a temperature sensitive bias circuit and an array core with a temperature variable select device. The array core can consist of a thin film diode in series with a nanoscale resistive memory cell. The temperature sensitive bias circuit can include a thin film diode in series with two resistors, and provides a temperature compensating bias voltage to the array core. The thin film diode of the temperature sensitive bias circuit tracks the diode of the array core, while the two resistors create a resistive ratio to mimic the effect of temperature and/or process variation(s) on the array core. The compensating bias reference voltage is generated by the temperature sensitive bias circuit, duplicated by a differential amplifier, and utilized to maintain a constant operation voltage level on the nanoscale resistive memory cell.

20 Claims, 8 Drawing Sheets

U.S. PATENT DOCUMENTS

| | | |
|---|---|---|
| 6,873,544 B1 * | 3/2005 | Perner et al. ............... 365/158 |
| 6,982,916 B1 * | 1/2006 | Tsang ......................... 365/213 |
| 7,012,276 B1 * | 3/2006 | Kingsborough et al. ...... 257/40 |
| 7,035,141 B1 * | 4/2006 | Tripsas et al. .............. 365/175 |
| 2002/0101767 A1 | 8/2002 | Naji |
| 2003/0067797 A1 | 4/2003 | Baker |

FOREIGN PATENT DOCUMENTS

EP    1538632    6/2005

* cited by examiner

TEMPERATURE COMPENSATION OF THIN FILM DIODE VOLTAGE THRESHOLD IN MEMORY SENSING CIRCUIT

TECHNICAL FIELD

The subject invention generally relates to memory devices and diodes for selecting memory cells in memory arrays. In particular, the subject invention relates to memory devices containing controllably conductive layer(s).

BACKGROUND ART

The basic functions of a computer and memory devices include information processing and storage. In typical computer systems, these arithmetic, logic, and memory operations are performed by devices that are capable of reversibly switching between two states often referred to as "0" and "1." Such switching devices are fabricated from semiconducting devices that perform these various functions and are capable of switching between two states at high speed.

Electronic addressing or logic devices, for instance for storage or processing of data, are made with inorganic solid state technology, and particularly crystalline silicon devices. The metal oxide semiconductor field effect transistor (MOSFET) is one the main workhorses.

Much of the progress in making computers and memory devices faster, smaller and cheaper involves integration, squeezing ever more transistors and other electronic structures onto a postage-stamp-sized piece of silicon. A postage-stamp-sized piece of silicon may contain tens of millions of transistors, each transistor as small as a few hundred nanometers. However, silicon-based devices are approaching their fundamental physical size limits.

Inorganic solid state devices are generally encumbered with a complex architecture which leads to high cost and a loss of data storage density. The circuitry of volatile semiconductor memories based on inorganic semiconductor material must constantly be supplied with electric current with a resulting heating and high electric power consumption in order to maintain stored information. Non-volatile semiconductor devices have a reduced data rate and relatively high power consumption and large degree of complexity.

Moreover, as inorganic solid state device sizes decrease and integration increases, sensitivity to alignment tolerances increases making fabrication markedly more difficult. Formation of features at small minimum sizes does not imply that the minimum size can be used for fabrication of working circuits. It is necessary to have alignment tolerances which are much smaller than the small minimum size, for example, one quarter the minimum size.

Scaling inorganic solid state devices raises issues with dopant diffusion lengths. As dimensions are reduced, the dopant diffusion lengths in silicon are posing difficulties in process design. In this connection, many accommodations are made to reduce dopant mobility and to reduce time at high temperatures. However, it is not clear that such accommodations can be continued indefinitely.

Applying a voltage across a semiconductor junction (in the reverse-bias direction) creates a depletion region around the junction. The width of the depletion region depends on the doping levels of the semiconductor. If the depletion region spreads to contact another depletion region, punch-through or uncontrolled current flow, may occur.

Higher doping levels tend to minimize the separations required to prevent punch-through. However, if the voltage change per unit distance is large, further difficulties are created in that a large voltage change per unit distance implies that the magnitude of the electric field is large. An electron traversing such a sharp gradient may be accelerated to an energy level significantly higher than the minimum conduction band energy. Such an electron is known as a hot electron, and may be sufficiently energetic to pass through an insulator, leading to irreversibly degradation of a semiconductor device.

Scaling and integration makes isolation in a monolithic semiconductor substrate more challenging. In particular, lateral isolation of devices from each other is difficult in some situations. Another difficulty is leakage current scaling. Yet another difficulty is presented by the diffusion of carriers within the substrate; that is free carriers can diffuse over many tens of microns and neutralize a stored charge.

SUMMARY OF THE INVENTION

The following is a summary of the invention in order to provide a basic understanding of some aspects of the invention. This summary is not intended to identify key/critical elements of the invention or to delineate the scope of the invention. Its sole purpose is to present some concepts of the invention in a simplified form as a prelude to the more detailed description that is presented later.

The subject invention provides for systems and methods of temperature compensation of thin film diode voltage levels in memory sensing circuits. Such temperature compensation can be utilized to maintain a consistent operation voltage across an array core and/or a memory array. The subject invention includes a sensing (cascode) circuit that can drive a read operation on an array core. The array core can consist of a thin film diode in series with a nanoscale resistive memory (NRM) cell. The thin film diode can experience fluctuations in threshold voltage due to process and/or temperature variations. For example, the thin film diode can experience a decrease in threshold voltage due to increases in ambient temperature. Such variations can result in a corresponding fluctuation of operation voltage levels reaching the NRM cell Further, the subject invention includes a temperature sensitive bias circuit to provide a temperature compensating bias voltage to maintain a constant operation voltage across the NRM cell. The bias temperature sensitive bias circuit can include a thin film diode to track the threshold voltage fluctuations of the diode in the array core. The thin film diode can be in series with two resistors, which create a resistive ratio used to mimic the temperature effect on the NRM cell of the array core. The temperature sensitive bias circuit can generate a reference temperature compensating bias voltage. The generated voltage is duplicated by a differential amplifier to the NRM cell in order to maintain a constant operation voltage across the NRM cell. It is to be noted that the subject invention is not limited to the utilization of thin film diodes, and that both the array core and the temperature sensitive bias circuit can be employed with various temperature variable select devices.

Hence, the subject invention is a simple, yet novel approach to compensate for diode threshold voltage variance due to process and/or temperature variations. The subject invention can protect a nanoscale resistive memory (NRM) cell in an array core from harmful high operation voltage levels that can potentially disturb the cell, and can avoid the occurrence of low operation voltage levels on the NRM cell that can cause error or low speed reads during the execution of a read operation, for example. In addition, it is understood that the subject invention can utilize any memory cell, with operation selection characteristics, in series with a selection device with a temperature variation.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
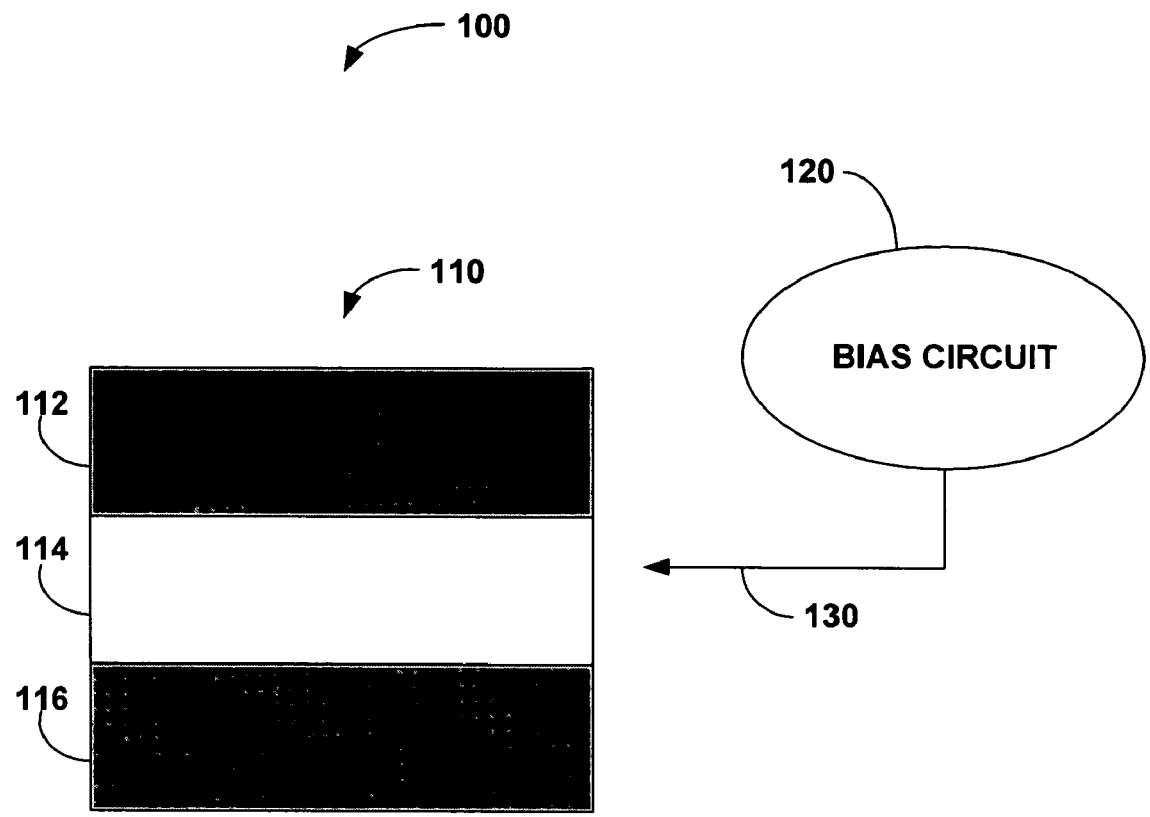
FIG. 1 illustrates a high-level block diagram of a thin film diode threshold tracking system in accordance with one aspect of the subject invention.

The subject invention is now described with reference to the drawings, wherein like reference numerals are used to refer to like elements throughout. In the following description, for purposes of explanation, numerous specific details are set forth in order to provide a thorough understanding of the subject invention. It may be evident, however, that the subject invention may be practiced without these specific details. In other instances, well-known structures and devices are shown in block diagram form in order to facilitate describing the subject invention.

The subject invention provides for systems and methods of temperature compensation of thin film diode voltage levels in memory sensing circuits. A differential amplifier can be employed to duplicate a compensating bias reference voltage, generated by a temperature sensitive bias circuit, to a NRM cell in an array core and/or a memory array utilizing one or more temperature variable select devices. The array core, for example, can include the NRM cell in series with a thin film diode. The temperature sensitive bias circuit provides for a thin film diode in series with two resistors. One of the resistors has a positive temperature coefficient and the other a negative temperature coefficient. As temperature and/or process variations influence the threshold voltage of the array core diode, the thin film diode of the temperature sensitive bias circuit tracks the diode in the array core and the resistors mimic the temperature effect on the NRM cell. As a result, the temperature sensitive bias circuit can generate the reference voltage in order to ensure that a constant read operation voltage, for example, is applied to the NRM cell despite the array core diode experiencing fluctuating threshold voltages.

The following discussion relates to the typical operation of a diode element and is intended to enhance the understanding of, but not limit or define, various aspects of the subject invention. In some instances, the following discussion of the operation of diodes may not apply to the subject invention, although such operation can be determined by one skilled in the art. A diode is essentially a two-region device separated by a junction. It either allows current to pass or prohibits it. Whether the current is allowed to pass, is determined by the voltage level and polarity, referred to as biasing. Generally, when the polarity of the applied voltage matches the polarity of the diode region at the junction, the diode is considered to be forward biased, permitting the current to flow. When the polarities are opposing, the diode is considered to be reverse biased, inhibiting the current flow. Current flow in a reverse biased diode can be achieved by raising the applied voltage to a level that forces the junction into breakdown. Generally, reaching this condition in a normal diode will damage it due to the generation of heat caused by the increased current. For zener-type diodes, however, breakdown is not a damaging condition and the current flow will once again stop when the applied voltage level is reduced below the level required to cause breakdown.

In general, the relationship between the current and voltage can be expressed using the ideal diode equation:

$$I_D = I_S \left( e^{\frac{qV_D}{nkT}} - 1 \right)$$

where $I_D$ is the current through the diode and $V_D$ is the voltage across the diode. Additionally, $I_S$ is the reverse saturation current (the current that flows through the diode when it is reverse biased—$V_D$ is negative), q is the electronic charge ($1.602 \times 10^{-19}$ C), k is Boltzmann's constant ($1.38 \times 10^{-23}$ J/° K), T=junction temperature in Kelvins, and n is the emission coefficient.

Zener diodes are designed to pass a current in the reverse direction when the voltage across it reaches a certain (negative) value, called the Zener voltage ($V_Z$). For diode voltages $V_D > -V_Z$, the Zener diode behaves like a normal diode. However, when $V_D = -V_Z$, the diode allows current to flow in the breakdown condition and keeps the voltage $V_D$ nearly constant at the value $-V_Z$. In this way, the Zener diode can act as a voltage regulator.

Although a reverse biased diode is ideally non-conducting, a small current still flows through the semiconductor junction when the voltage is applied due to the presence of minority carriers. The total reverse current can be approximated by:

$$J_S = q\sqrt{\frac{D_p}{\tau_p}}\frac{n_i^2}{N_D} + \frac{qn_iW}{\tau_n}$$

where $D_p$ is the hole diffusion coefficient, $\tau_p$ and $\tau_n$ are the effective lifetime constants of the holes and the electrons in a depletion region. The reverse current is the sum of the diffusion component in the neutral region and the generation current in the depletion region. The diffusion current is due to the change in concentration of the charges through the material. The second term comes from the emission of charges through the deep levels present within an energy band gap. Additionally, W is the width of the depletion region, $n_i$ is the intrinsic density and $N_D$ is the donor density.

The work functions of the two materials used to form a diodic junction determine the potential barrier formed at the junction. The work function is defined as the energy difference between the vacuum level and the Fermi level, $E_F$. As an example, assume a metal layer and an n-type semiconductor layer are used to form the diodic layer of the subject invention. Therefore, the work function of the metal layer is denoted by $q\phi_m$, and the semiconductor layer is denoted $q(\chi+V_n)$, where $\chi$, the electron affinity of the semiconductor, is the difference in energy between the bottom of the conduction band, $E_C$, and the vacuum level. Additionally, $qV_n$ is the difference between $E_C$ and the Fermi level.

When the metal and the semiconductor layers are in contact, a charge will flow from the semiconductor to the metal. The semiconductor is n-type, so its work function is smaller than the metal work function. As the distance between the two layers decreases, an increasing negative charge is built up at the metal surface. An equal and opposite charge exists in the semiconductor. When the distance between the layers is comparable with the interatomic distance, the gap becomes transparent to electrons. The limiting value for the barrier height $q\phi_{Bn}$ is given by:

$$q\phi_{Bn} = q(\phi_m - \chi).$$

The barrier height is then the difference between the metal work function and the electron affinity of the semiconductor.

The supra formulae are meant to give a basic understanding of the formulae utilized for determining various attributes of a diodic layer. They are not meant to be the only equations that can be used to determine the characteristics necessary for an aspect of the subject invention. One skilled in the art can appreciate the simplistic nature represented here and acknowledge that more complex formulae can be performed to determine higher-level diodic properties. The charge carrier and barrier potentials of p-n type diodic layers are discussed infra. This type of junction is commonly found in diodes and is discussed here as an example of how a diode works, not as the only means of the subject invention. It is understood that while zener-type diodes have been included in the discussion, such inclusion is not intended to indicate that the subject invention is a zener-type diode, but can, for example, exhibit behaviors similar to that of a zener-type diode. Although the preceding discussion focused on aspects of diodes and zener-type diodes, it is acknowledged that the subject invention can be implemented with various temperature variable select devices. Finally, it is appreciated that the subject invention is not limited to the aforementioned equations, aspects, and characteristics of a typical diode element.

Referring initially to FIG. 1, a high-level block diagram of a thin film diode threshold tracking system is shown in accordance with one aspect of the subject invention. The system 100 includes a nanoscale resistive memory (NRM) cell 110 and a temperature sensitive bias circuit 120. The NRM cell 110 includes a first electrode 112, a second electrode 116, and a controllably conductive media 114. The temperature sensitive bias circuit 120 provides the NRM cell 110 with a reference voltage 130 during a NRM cell read operation. It is appreciated, however, that the reference voltage 130 could also be used to maintain a constant operation voltage during a program and/or erase operation, for example. The temperature sensitive bias circuit 120 and the NRM cell 110 can both utilize the same type of thin film diode. The thin film diode of the temperature sensitive bias circuit 120 tracks and/or mimics the voltage across the thin film diode associated with the NRM cell 110. As ambient temperature and/or process variations occur during a NRM cell operation, the threshold voltage of the thin film diode associated with the NRM cell 110 can vary. For example, an increase in ambient temperature can decrease the threshold voltage. Such variance in the threshold voltage of the thin film diode associated with the NRM cell 110 can result in different operation voltages across the NRM cell 110. In order to compensate for the effects of such process variations (e.g. temperature increase), the temperature sensitive bias circuit 120 provides the NRM cell 110 with a compensating bias reference voltage 130 to ensure that a constant NRM cell operation voltage is applied to the NRM cell 110 during an NRM cell operation. A constant voltage level during a read operation, for example, can then be maintained. Such voltage maintenance is a critical factor in NRM cell performance and/or NRM cell array performance because a low applied voltage results in a slow read operation within the NRM cell and a high applied voltage can result in disturbing the NRM cell's condition and/or state. According to one aspect of the subject invention, a differential amplifier can duplicate the reference voltage from the temperature sensitive bias circuit 120 to the NRM cell 110.

Figure 2:
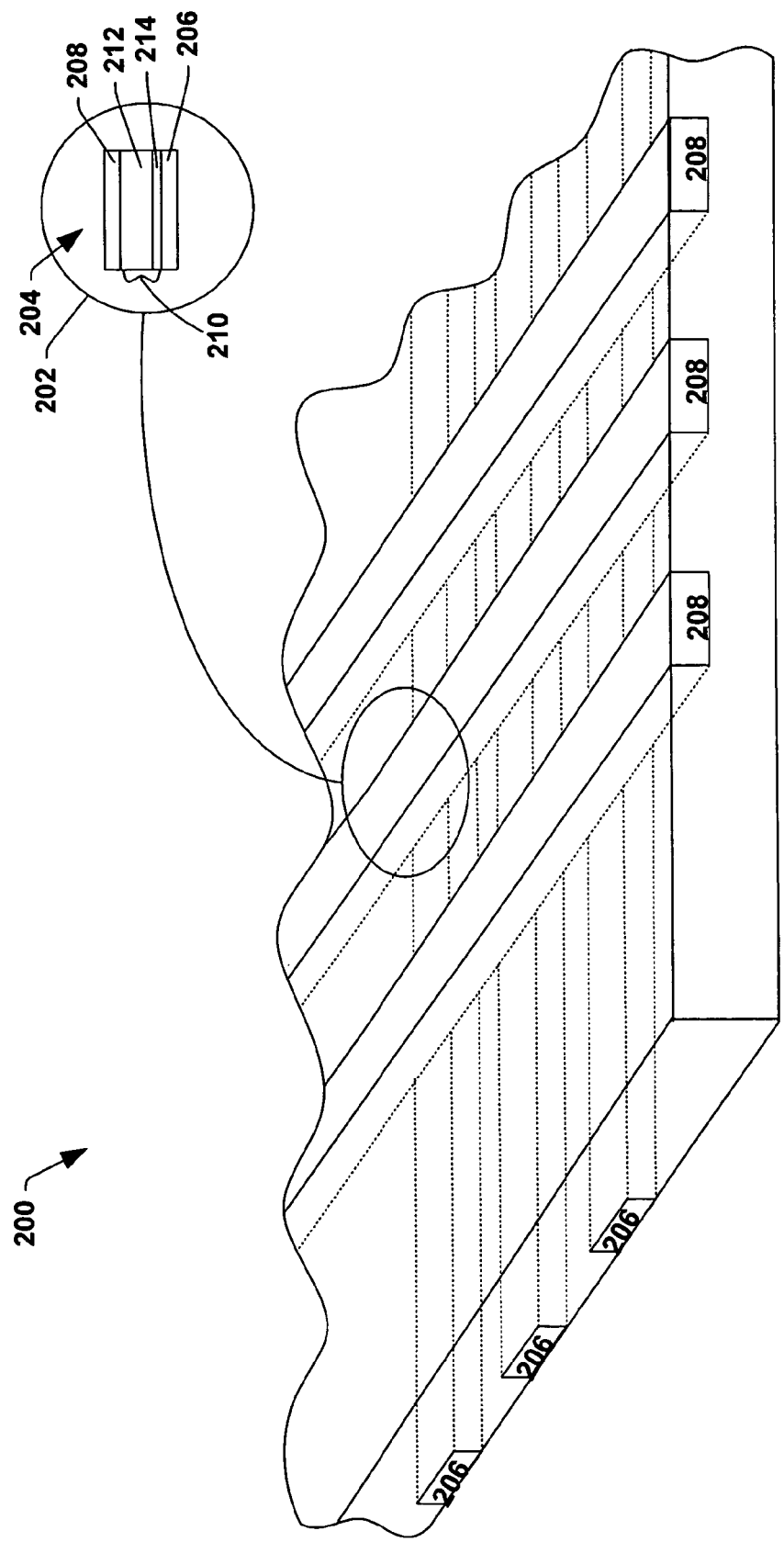
FIG. 2 illustrates a perspective view of a two dimensional microelectronic device containing a plurality of memory cells that can be utilized in accordance with one aspect of the subject invention.

Turning to FIG. 2, a brief description of an exemplary microelectronic memory device 200 containing a plurality of memory cells that can be utilized with one aspect of the invention is shown, as well as an exploded view 202 of an exemplary memory cell 204. It is understood that other memory devices and one or more memory cells with similar characteristics can interact with an aspect of the subject invention as well. The microelectronic memory device 200, for example, contains a desired number of memory cells, as determined by the number of rows, columns, and layers (three dimensional orientation described later) present. The first electrodes 206 and the second electrodes 208 are shown in substantially perpendicular orientation, although other orientations are possible to achieve the structure of the exploded view 202. Each memory cell 204 contains a first electrode 206 and a second electrode 208 with a controllably conductive media 210 therebetween. The controllably conductive media 210 contains a low conductive layer 212 and a passive layer 214. Peripheral circuitry and devices are not shown for brevity.

The memory cells contain at least two electrodes, as one or more electrodes may be disposed between the two electrodes that sandwich the controllably conductive media. The electrodes are made of conductive material, such as conductive metal, conductive metal alloys, conductive metal oxides, conductive polymer films, semiconductive materials, and the like.

Examples of electrodes include one or more of aluminum, chromium, copper, germanium, gold, magnesium, manganese, indium, iron, nickel, palladium, platinum, silver, titanium, zinc, and alloys thereof; indium-tin oxide (ITO); polysilicon; doped amorphous silicon; metal silicides; and the like. Alloy electrodes specifically include Hastelloy®, Kovar®, Invar, Monel®, Inconel®, brass, stainless steel, magnesium-silver alloy, and various other alloys.

The controllably conductive media, disposed between the two electrodes, can be rendered conductive, semiconductive, or nonconductive in a controllable manner using an external stimuli. Generally, in the absence of an external stimuli, the controllably conductive media is nonconductive or has a high impedance. Further, in some embodiments, multiple degrees of conductivity/resistivity may be established for the controllably conductive media in a controllable manner. For example, the multiple degrees of conductivity/resistivity for the controllably conductive media may include a nonconductive state, a highly conductive state, and a semiconductive state.

The controllably conductive media can be rendered conductive, non-conductive or any state therebetween (degree of conductivity) in a controllable manner by an external stimulus (external meaning originating from outside the controllably conductive media). For example, under an external electric field, radiation, and the like, a given nonconductive controllably conductive media is converted to a conductive controllably conductive media.

The controllably conductive media contains one or more low conductive layers and one or more passive layers. In one embodiment, the controllably conductive media contains at least one organic semiconductor layer that is adjacent a passive layer (without any intermediary layers between the organic semiconductor layer and passive layer). In another embodiment, the controllably conductive media contains at least one inorganic low conductive layer that is adjacent a passive layer (without any intermediary layers between the inorganic layer and passive layer). In yet another embodiment, the controllably conductive media contains a mixture of organic and inorganic materials as the low conductive layer that is adjacent a passive layer (without any intermediary layers between the low conductive layer and passive layer).

The organic semiconductor layer contains at least one of an organic polymer (such as a conjugated organic polymer), an organometallic compound (such as a conjugated organometallic compound), an organometallic polymer (such as a conjugated organometallic polymer), a buckyball, a carbon nanotube (such as a C6–C60 carbon nanotubes), and the like. Organic semiconductors thus have a carbon based structure, often a carbon-hydrogen based structure, which is different from conventional MOSFETs. The organic semiconductor materials are typically characterized in that they have overlapping p orbitals, and/or in that they have at least two stable oxidation states. The organic semiconductor materials are also characterized in that they may assume two or more resonant structures. The overlapping p orbitals contribute to the controllably conductive properties of the controllably conductive media. The amount of charge injected into the organic semiconductor layer also influences the degree of conductivity of the organic semiconductor layer.

The organic polymer typically contains a conjugated organic polymer. The polymer backbone of the conjugated organic polymer extends lengthwise between the electrodes (generally substantially perpendicular to the inner, facing surfaces of the electrodes). The conjugated organic polymer may be linear or branched, so long as the polymer retains its conjugated nature. Conjugated polymers are characterized in that they have overlapping p orbitals. Conjugated polymers are also characterized in that they may assume two or more resonant structures. The conjugated nature of the conjugated organic polymer contributes to the controllably conductive properties of the controllably conductive media.

In this connection, the low conductive layer or organic semiconductor layer, such as the conjugated organic polymer, has the ability to donate and accept charges. Generally, the organic semiconductor or an atom/moiety in the polymer has at least two relatively stable oxidation states. The two relatively stable oxidation states permit the organic semiconductor to donate and accept charges and electrically interact with the conductivity facilitating compound. The ability of the organic semiconductor layer to donate and accept charges and electrically interact with the passive layer also depends on the identity of the conductivity facilitating compound. The injected charges from the passive layer can be trapped in the organic semiconductor layer and the interface adjacent to the passive layer. This changes the conductivity of the low conductive layer and results in memory effect.

The organic polymers (or the organic monomers constituting the organic polymers) may be cyclic or acyclic. During formation or deposition, the organic polymer self assembles between the electrodes. Examples of conjugated organic polymers include one or more of polyacetylene; polyphenylacetylene; polydiphenylacetylene; polyaniline; poly(p-phenylene vinylene); polythiophene; polyporphyrins; porphyrinic macrocycles, thiol derivatized polyporphyrins; polymetallocenes such as polyferrocenes, polyphthalocyanines; polyvinylenes; polystiroles; poly(t-butyl) diphenylacetylene; poly(trifluoromethyl)diphenylacetylene; polybis(trifluoromethyl)acetylene; polybis(t-butyldiphenyl) acetylene; poly(trimethylsilyl)diphenylacetylene; poly(carbazole)diphenylacetylene; polydiacetylene; polypyridineacetylene; polymethoxyphenylacetylene; polymethylphenylacetylene; poly(t-butyl)phenylacetylene; polynitro-phenylacetylene; poly(trifluoromethyl)phenylacetylene; poly(trimethylsilyl)pheylacetylene; polydipyrrylmethane; polyindoqiunone; polydihydroxyindole; polytrihydroxyindole; furane-polydihydroxyindole; polyindoqiunone-2-carboxyl; polyindoqiunone; polybenzobisthiazole; poly(p-phenylene sulfide); polypyrrole; polystyrene; polyfuran; polyindole; polyazulene; polyphenylene; polypyridine; polybipyridine; polysexithiofene; poly(siliconoxohemiporphyrazine); poly(germaniumoxohemiporphyrazine); poly(ethylenedioxythiophene); polypyridine metal complexes; and the like.

In addition to or as an alternative to the organic material, the active low conductive layer may contain an inorganic material. Inorganic materials include transition metal sulfides, chalcogenides, and transition metal oxides. The oxide of a transition metal, represented by the general formula $M_xO_y$, where M is a transition metal, and x and y are independently from about 0.25 to about 5, usually has low conductivity. Analogous transition metal sulfides may also be used. The transition metal in the oxide allows multi oxidation states that lead to conductivity changes under an external field. Examples include cupper oxide ($CuO$, $Cu_2O$), iron oxide ($FeO$, $Fe_3O_4$), manganese oxide ($MnO_2$, $Mn_2O_3$, etc), titanium oxide ($TiO_2$). This material can be formed by thermal evaporation, CVD, or plasma. One advantage to using an inorganic material is that it has more flexibility with high temperature manufacture processes that in turn makes it possible to combine its use with conventional technology to deposit top layer(s) such as electrode. Another advantage is that inorganic materials have high heat diffusion capabilities. This allows high current operation of the resultant device with high reliability.

The active low conductive layer can be mixture of organic and inorganic materials. The inorganic material (transition metal oxide/sulfide) is usually embedded in an organic semiconductor material. Examples include polyphenylacetylene mixed with $Cu_2S$, polyphenylacetylene mixed with $Cu_2O$, and the like. This layer can be formed by economical methods. For example, one can spin on polyphenylacetylene dissolved with a $Cu^+$ salt such as copper styrene 4-sulfonate. The substrate can be a passive layer or facilitation layer. A CVD method then is used to introduce a reactive gas such as $H_2S$ to react with $Cu^+$ to produce uniformly embedded $Cu_2S$. This type of organic-inorganic mixture material can have controlled initial conductivity by adjusting the copper ion concentration. Another advantage over pure organic materials is that organic-inorganic mixture materials can in some instances have good heat diffusion capabilities due to the presence of the inorganic material. Therefore, it can allow high current operation of the resultant device with good reliability.

In one embodiment, the new memory cells contain both inorganic $Cu_2O$ and an organic semiconductor material as the active low conductive layer. In this embodiment, the $Cu_2O$ is just above the passive layer and has a thickness from about 1 nm to about 3 nm. The organic semiconductor material is above the $Cu_2O$ and has a thickness of about 0.001 µm or more and about 1 µm or less.

In one embodiment, the low conductive layer contains a thin layer designed to improve or lengthen charge retention time. The thin layer may be disposed anywhere within the low conductive layer, but typically near the middle of the layer. The thin layer contains any of the electrode materials or the compounds of the below-described heterocyclic/aromatic compound layer. In one embodiment, the thin layer has a thickness of about 50 Å or more and about 0.1 µm or less. In another embodiment, the thin layer has a thickness of about 100 Å or more and about 0.05 µm or less. For example, a memory cell may contain a first electrode of copper, a passive layer of copper sulfide, a low conductive layer of poly(phenylene vinylene), and a second electrode of aluminum, wherein the poly(phenylene vinylene) low conductor layer contains a 250 Å thick layer of copper therein.

In one embodiment, the low conductive layer is not doped with a salt. In another embodiment, the low conductive layer is doped with a salt. A salt is an ionic compound having an anion and cation. General examples of salts that can be employed to dope the low conductive layer include alkaline earth metal halogens, sulfates, persulfates, nitrates, phosphates, and the like; alkali metal halogens, sulfates, persulfates, nitrates, phosphates, and the like; transition metal halogens, sulfates, persulfates, nitrates, phosphates, and the like; ammonium halogens, sulfates, persulfates, nitrates, phosphates, and the like; quaternary alkyl ammonium halogens, sulfates, persulfates, nitrates, phosphates, and the like.

In one embodiment, the low conductive layer has a thickness of about 0.001 µm or more and about 5 µm or less. In another embodiment, the low conductive layer has a thickness of about 0.01 µm or more and about 2.5 µm or less. In yet another embodiment, the low conductive layer has a thickness of about 0.05 µm or more and about 1 µm or less.

The low conductive layer may be formed by spin-on techniques (depositing a mixture of the polymer/polymer precursor and a solvent, then removing the solvent from the substrate/electrode), by chemical vapor deposition (CVD) optionally including a gas reaction, gas phase deposition, and the like. CVD includes low pressure chemical vapor deposition (LPCVD), plasma enhanced chemical vapor deposition (PECVD), and high density chemical vapor deposition (HDCVD). During formation or deposition, the low conductor material may self assemble between the electrodes. It is not typically necessary to functionalize one or more ends of an organic polymer in order to attach it to an electrode/passive layer.

A covalent bond may be formed between the low conductive material and the passive layer. Alternatively, close contact is required to provide good charge carrier/electron exchange between the low conductive layer and the passive layer. The low conductive layer and the passive layer are electrically coupled in that charge carrier/electron exchange occurs between the two layers.

A passive layer contains at least one conductivity facilitating compound that contributes to the controllably conductive properties of the controllably conductive media. The conductivity facilitating compound has the ability to donate and accept charges (holes and/or electrons). The passive layer thus may transport between an electrode and the low conductive layer/passive layer interface, facilitate charge/carrier injection into the low conductive layer, and/or increase the concentration of a charge carrier in the low conductive layer. In some instances, the passive layer may store opposite charges thereby providing a balance of charges in the memory device as a whole. Storing charges/charge carriers is facilitated by the existence of two relatively stable oxidation states for the conductivity facilitating compound.

In other instances, the passive layer has ferroelectric behavior such as ionic displacement under external field. This often occurs at the junction with the active layer. The "ferroelectric" property results in the polarity effected by external field that significantly modifies the interface states and then changes conductivity of the memory cell. The memory cell made from this type of passive layer material has ionic-electronic conductive mechanism, and its data retention time is usually relatively longer because of the displacement of the metal ion at the interface. However, it is disadvantageous in some instances because it sometimes requires a longer time to switch the memory cell from one state to the other.

Generally, the conductivity facilitating compound or an atom in the conductivity facilitating compound has at least two relatively stable oxidation states. The two relatively stable oxidation states permit the conductivity facilitating compound to donate and accept charges and electrically interact with the low conductive layer. The particular conductivity facilitating compound employed in a given memory cell is selected so that the two relatively stable oxidation states match with the two relatively stable oxidation states of the low conductive material. Matching the energy bands of two relatively stable oxidation states of the low conductive material and the conductivity facilitating compound facilitate charge carrier retention in the low conductive layer.

Matching energy bands means that the Fermi level of the passive layer is close to the valence band of the active low conductive layer. Consequently, the injected charge carrier (into the active layer) may recombine with the charge at the passive layer if the energy band of the charged low conductive layer does not substantially change. Matching energy bands involves compromising between ease of charge injection and length of charge (data) retention time.

In one embodiment, when matching energy bands, the Fermi level of the passive layer is within about 0.3 eV of the valence band of the low conductive layer. In another embodiment, the Fermi level of the passive layer is within about 0.25 eV of the valence band of the low conductive layer. In yet another embodiment, the Fermi level of the passive layer is within about 0.2 eV of the valence band of the low conductive layer. In still yet another embodiment, the Fermi level of the passive layer is within about 0.15 eV of the valence band of the low conductive layer. The valence band, in some instances, is the highest occupied molecular orbital (HOMO) of the material.

The applied external field can reduce the energy barrier between passive layer and low conductive layer depending on the field direction. Therefore, enhanced charge injection in the forward direction field in programming operation and also enhanced charge recombination in reversed field in erase operation can be obtained.

The passive layer may in some instances act as a catalyst when forming the low conductive layer, particularly when the low conductive layer contains a conjugated organic polymer. In this connection, the polymer backbone of the conjugated organic polymer may initially form adjacent the passive layer, and grow or assemble away and substantially perpendicular to the passive layer surface. As a result, the polymer backbones of the conjugated organic polymers are self aligned in a direction that traverses the two electrodes.

Examples of conductivity facilitating compounds that may make up the passive layer include one or more of copper sulfide ($Cu_xS$, where x is from about 0.5 to about 3), silver sulfide ($Ag_2S$, AgS), gold sulfide ($Au_2S$, AuS), and the like. Among these materials, $Cu_2S$ and $Ag_2S$ may have ferroelectric properties, meaning metal ions have displacement under an external operation field. The passive layer may contain two or more sub-passive layers, each sub-layer containing the same, different, or multiple conductivity facilitating compounds.

The passive layer is grown using oxidation techniques, formed via gas phase reactions, or deposited between the electrodes. In some instances, to promote long charge retention times (in the low conductive layer), the passive layer may be treated with a plasma after it is formed. The plasma treatment modifies the energy barrier of the passive layer.

In one embodiment, the passive layer containing the conductivity facilitating compound has a thickness of about 2 Å or more and about 0.1 µm or less. In another embodiment, the passive layer has a thickness of about 10 Å or more and about 0.01 µm or less. In yet another embodiment, the passive layer has a thickness of about 50 Å or more and about 0.005 µm or less.

In order to facilitate manufacture and operation of the new memory cells, the active low conductive layer is thicker than the passive layer. In one embodiment, the thickness of the low conductive layer is from about 10 to about 500 times greater than the thickness of the passive layer. In another embodiment, the thickness of the low conductive layer is from about 25 to about 250 times greater than the thickness of the passive layer.

The area size of the individual memory cells (as measured by the surface area of the two electrodes directly overlapping each other) can be small compared to conventional silicon based memory cells such as MOSFETs. In one embodiment, the area size of the memory cells of the subject invention is about 0.0001 $\mu m^2$ or more and about 4 $\mu m^2$ or less. In another embodiment, the area size of the memory cells is about 0.001 $\mu m^2$ or more and about 1 $\mu m^2$ or less.

Operation of the new memory devices/cells is facilitated using an external stimuli to achieve a switching effect. The external stimuli include an external electric field and/or light radiation. Under various conditions, the memory cell is either conductive (low impedance or "on" state) or nonconductive (high impedance or "off" state).

Generally speaking, the presence of an external stimuli such as an applied electric field that exceeds a threshold value ("on" state) permits an applied voltage to write or erase information into/from the memory cell and the presence of an external stimuli such as an applied electric field that is less than a threshold value permits an applied voltage to read information from the memory cell; whereas the absence of the external stimuli that exceeds a threshold value ("off" state) prevents an applied voltage to write or erase information into/from the memory cell.

To write information into the memory cell, a voltage or pulse signal that exceeds the threshold is applied. To read information written into the memory cell, a voltage or electric field of any polarity is applied. Measuring the impedance determines whether the memory cell is in a low impedance state or a high impedance state (and thus whether it is "on" or "off"). To erase information written into the memory cell, a negative voltage or a polarity opposite the polarity of the writing signal that exceeds a threshold value is applied.

The memory cell may further have more than one conductive or low impedance state, such as a very highly conductive state (very low impedance state), a highly conductive state (low impedance state), a conductive state (medium level impedance state), and a non-conductive state (high impedance state) thereby enabling the storage of multiple bits of information in a single memory cell, such as 2 or more bits of information or 4 or more bits of information.

The memory devices described herein can be employed to form logic devices such as central processing units (CPUs); volatile memory devices such as DRAM devices, SRAM devices, and the like; input/output devices (I/O chips); and non-volatile memory devices such as EEPROMs, EPROMs, PROMs, and the like. The memory devices may be fabricated in planar orientation (two dimensional) or three dimensional orientation containing at least two planar arrays of the memory cells.

Figure 3:
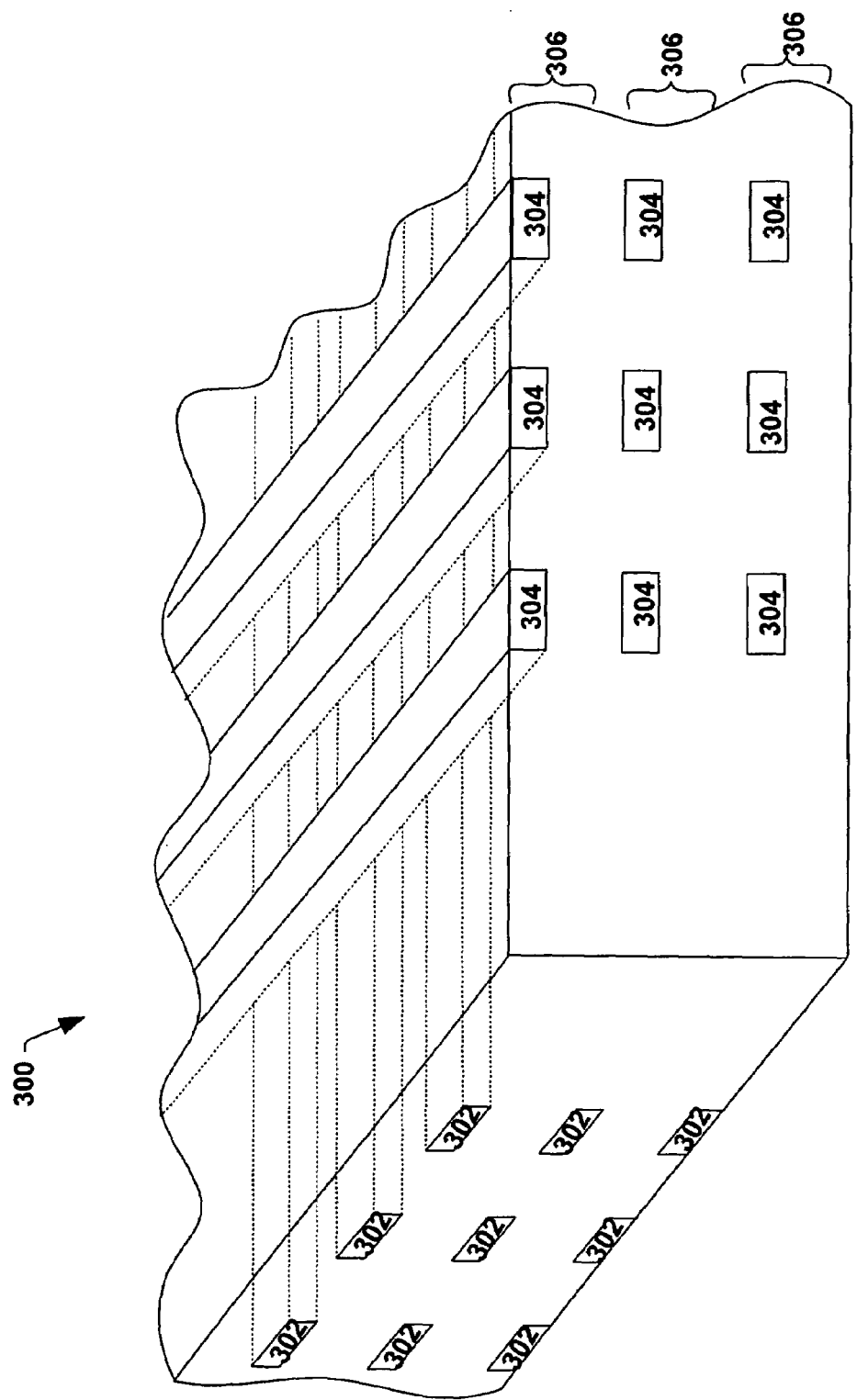
FIG. 3 illustrates a perspective view of a three dimensional microelectronic device containing a plurality of memory cells that can be utilized in accordance with another aspect of the subject invention.

Referring to FIG. 3, an exemplary three dimensional microelectronic memory device 300 containing a plurality of memory cells that can be utilized in accordance with an aspect of the invention is shown. The three dimensional microelectronic memory device 300 contains a plurality of first electrodes 302, a plurality of second electrodes 304, and a plurality of memory cell layers 306. Between the respective first and second electrodes are the controllably conductive media (not shown). The plurality of first electrodes 302 and the plurality of second electrodes 304 are shown in substantially perpendicular orientation, although other orientations are possible. The three dimensional microelectronic memory device is capable of containing an extremely high number of memory cells thereby improving device density. Peripheral circuitry and devices are not shown for brevity.

The memory cells/devices are useful in any device requiring memory. For example, the memory devices are useful in computers, appliances, industrial equipment, hand-held devices, telecommunications equipment, medical equipment, research and development equipment, transportation vehicles, radar/satellite devices, and the like. Hand-held devices, and particularly hand-held electronic devices, achieve improvements in portability due to the small size and light weight of the new memory devices. Examples of hand-held devices include cell phones and other two way communication devices, personal data assistants, palm pilots, pagers, notebook computers, remote controls, recorders (video and audio), radios, small televisions and web viewers, cameras, and the like.

Figure 4:
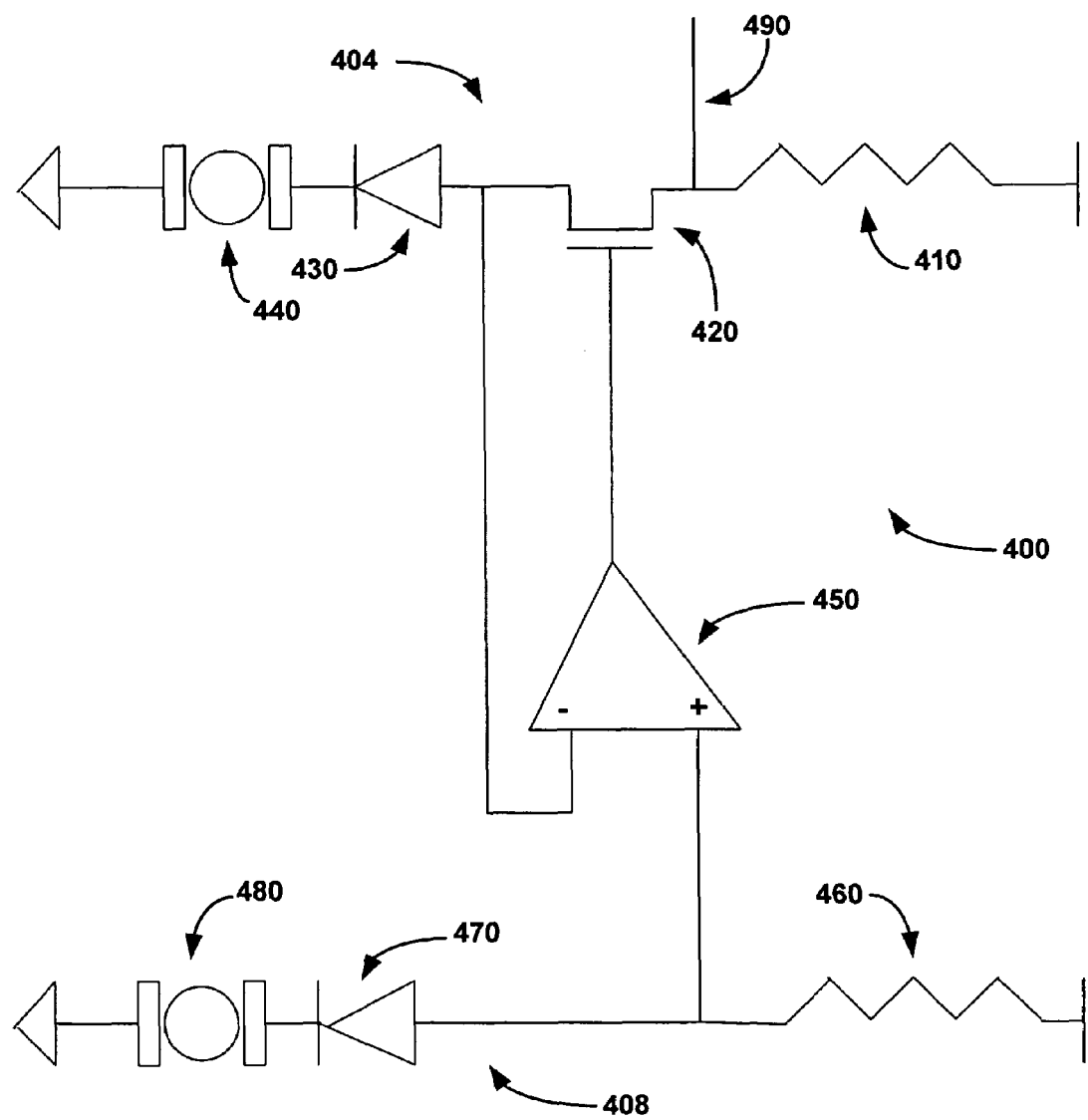
FIG. 4 illustrates a schematic of a memory cell read operation voltage system in accordance with one aspect of the subject invention.

FIG. 4 provides a schematic of a memory cell read operation voltage system in accordance with one aspect of the subject invention. The system 400 includes a sensing circuit 404, a bias circuit 408, and a differential amplifier 450. The sensing circuit 404 includes a first resistor 410, a sensing device 420, a select diode 430, and a memory cell 440. The memory cell 440, for example, can be a NRM cell. A read operation can be executed by providing a read operation voltage to the select diode 430 and the memory cell 440. As ambient temperature and/or process variations occur during the read operation, the threshold voltage of the select diode 430 can vary. For example, an increase in ambient temperature can decrease the threshold voltage. Such variance in the threshold voltage of the select diode 430 can result in a fluctuation of read operation voltages across the memory cell 440. In order to compensate for the read operation voltage fluctuations, the bias circuit 408 generates a reference voltage that can be applied to the memory cell 440 in order to maintain a constant read operation voltage. The bias circuit 408 can include a second resistor 460, a reference diode 470 of the same type as the select diode 430, and a reference memory cell 480 as well. The reference diode 470 provides the tracking capability of any variations happening in the memory cell 440. As the bias circuit generates a reference voltage, it is supplied to the sensing circuit via the differential amplifier 450. Application of the reference voltage generated by the bias circuit 408 maintains a constant read operation voltage in the memory cell 440, despite any variations in the threshold voltage of the select diode 430. It is appreciated that similar implementations of the system 400 can be utilized to maintain a constant operation voltage for other operations, such as, for example, a program operation and/or an erase operation.

Figure 5:
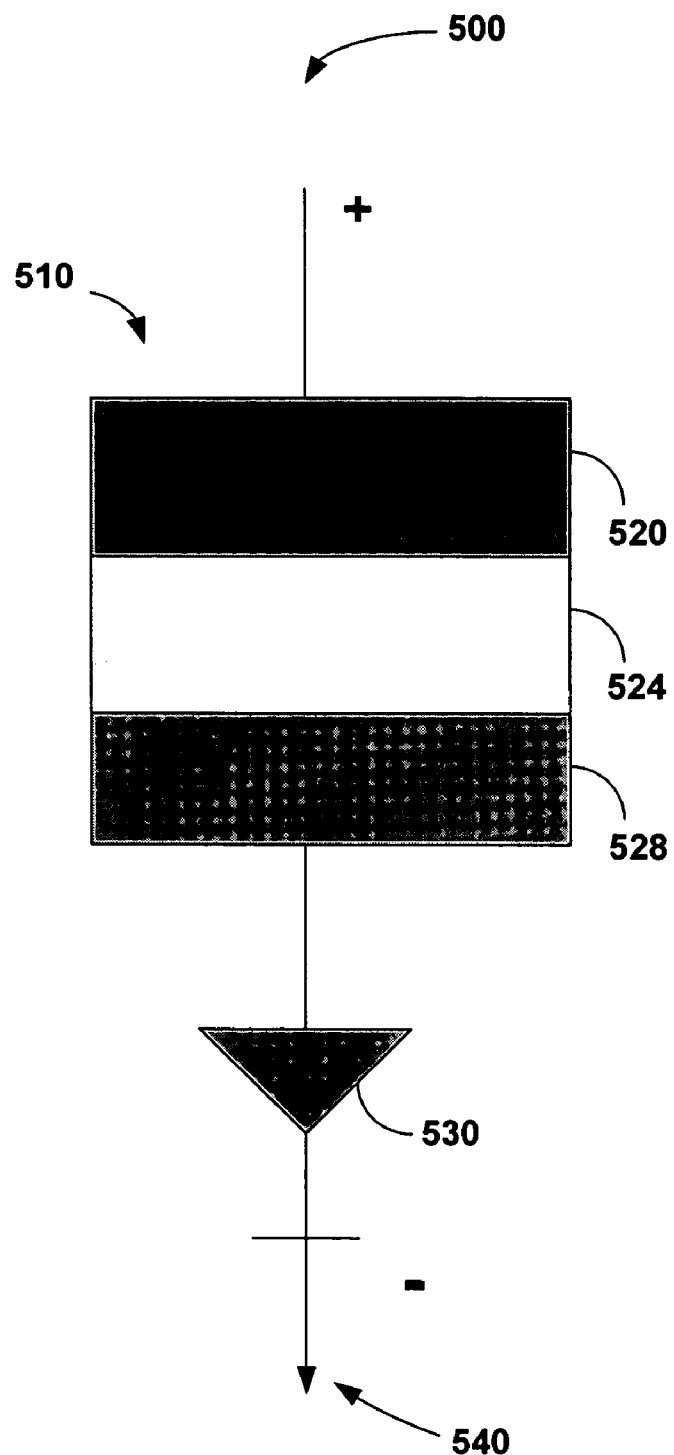
FIG. 5 illustrates an array core in accordance with one aspect of the subject invention.

Turning now to FIG. 5, a diagram illustrating an array core in accordance with one aspect of the invention is provided. The array core 500 includes a nanoscale resistive memory (NRM) cell 510 in series with a thin film diode 530. As discussed supra, the NRM cell 510 has a controllably conductive media 524 between a first electrode 520 and a second electrode 528. Electrical current is allowed to flow through the NRM cell 510, when the forward voltage is greater than the turn-on voltage level of the thin film diodic layer 530. The actual current value is dependent upon the value of the applied voltage from the voltage source. In this manner, the NRM cell 510 can be programmed and/or erased.

In another instance, a reverse bias voltage can be applied to the NRM cell 510 by a voltage source. When the voltage level is less than the breakdown voltage level of the thin film diodic layer 530, the leakage current is very small and, thus, the current flow through the NRM cell 510 is also small. Because the diode cannot flow a significant amount of current until a certain reverse bias voltage threshold is reached (e.g., breakdown voltage), it prevents inadvertent low level reverse bias voltages from erasing the NRM cell 510, for example. However, certain process variations and/or an increase in ambient temperature can occur to influence breakdown characteristics of the diodic layer 530, thereby resulting in varying operation voltages reaching the cell. The temperature sensitive bias circuit of the subject invention herein described provides a reference temperature compensating bias voltage via a differential amplifier to effect a constant NRM cell operation voltage, thereby minimizing the effect of operation voltage level fluctuations on the NRM cell. It is understood that FIG. 5 illustrates an exemplary array core and that the subject invention can also utilize other memory array configurations that include a temperature variable select device. In addition, it is noted that the temperature variable select device (e.g., thin film diode) employed in the subject invention may have either a positive temperature coefficient or a negative temperature coefficient.

Figure 6:
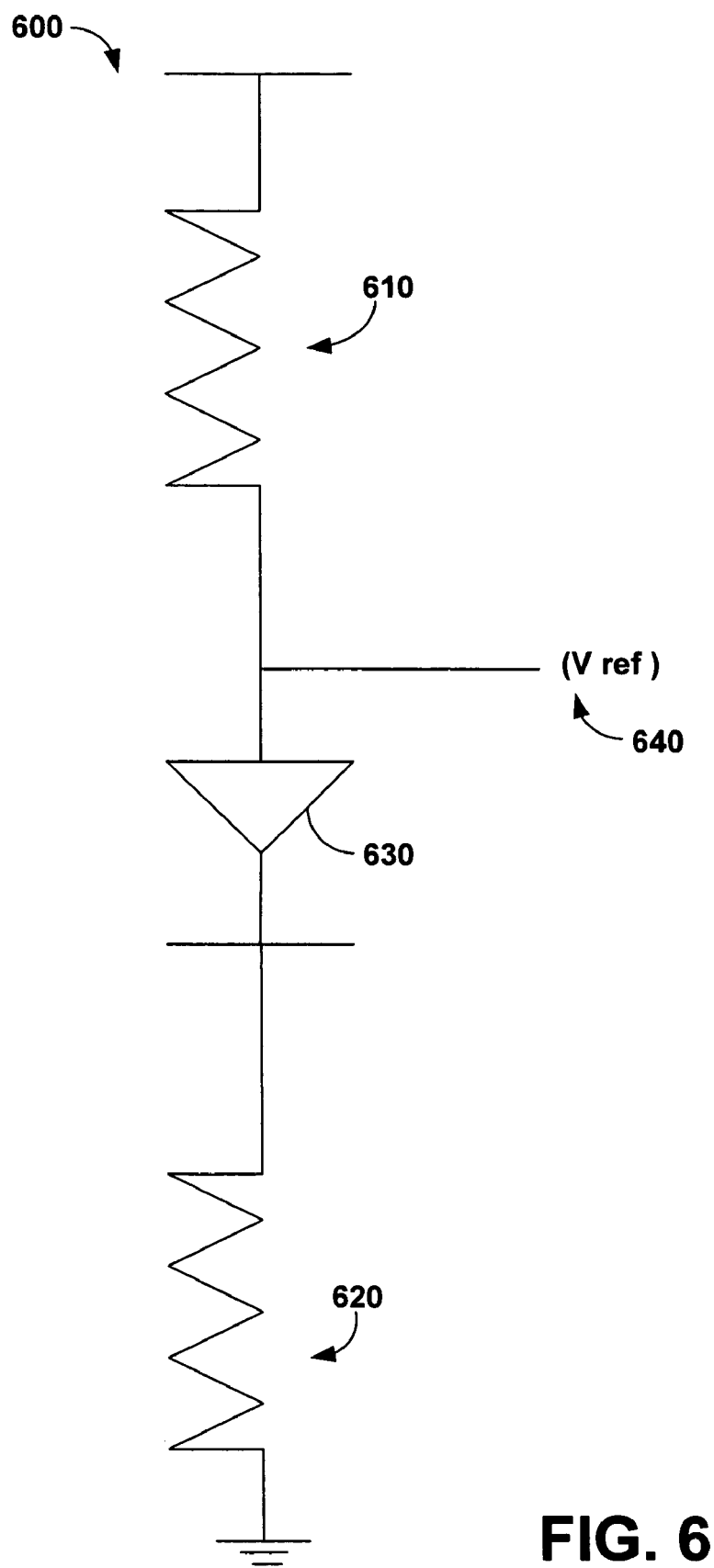
FIG. 6 provides a schematic of a temperature sensitive bias circuit in accordance with one aspect of the subject invention.

Referring to FIG. 6, a schematic of a temperature sensitive bias circuit is provided in accordance with one aspect of the subject invention. The circuit 600 includes a temperature variable select device 630 in series with a first resistor 610 and a second resistor 620. The temperature variable select device 630 can track the same type temperature variable select device of an array core. The two resistors 610, 620 each have a temperature coefficient, one positive and the other negative. Thus, a resistive ratio is created to mimic the effects of temperature variations occurring at the array core and influencing an NRM cell of the core. The temperature sensitive bias circuit thereby generates a reference voltage 640 that can be applied to the NRM cell to maintain a constant read operation voltage level on the cell, for example.

Figure 7:
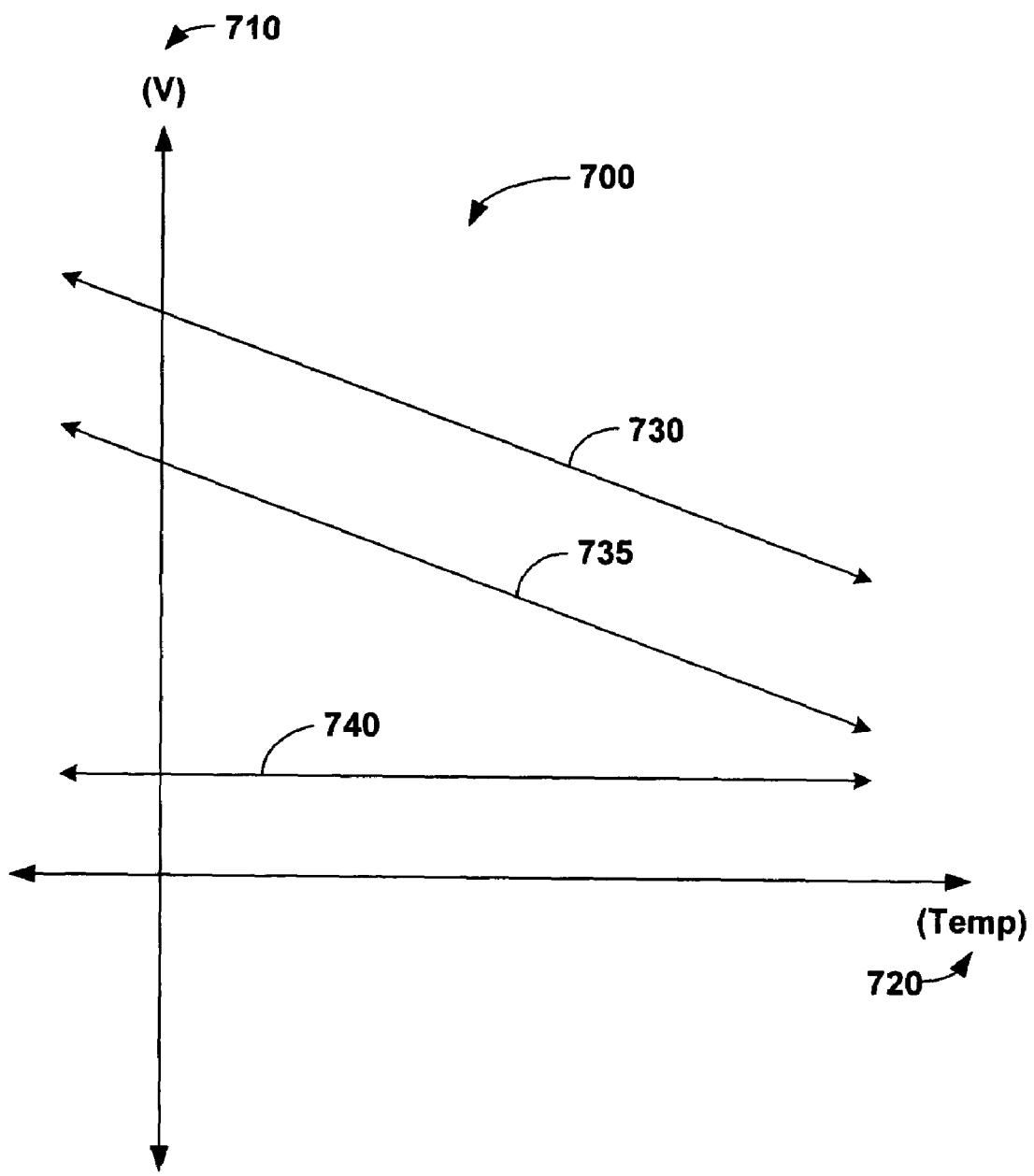
FIG. 7 illustrates a graph depicting voltage level characteristics upon implementation of one aspect of the subject invention.

FIG. 7 illustrates a graph depicting voltage level characteristics upon implementation of one aspect of the subject invention. Graph 700 includes a vertical axis 710 for representing voltage, and a horizontal axis 720 for representing temperature. Graph 700 displays, that upon execution of a read operation in an array core, the read operation voltage 730 and/or the array core diode threshold voltage 735 can decrease due to process and/or ambient temperature variations. However, the read operation voltage on the NRM cell 740 of the array core will be maintained at a constant voltage level due to the aforementioned temperature sensitive bias circuit of the subject invention generating a compensating bias reference voltage. As discussed supra, the bias reference voltage is supplied to the NRM cell of the array core via a differential amplifier.

Figure 8:
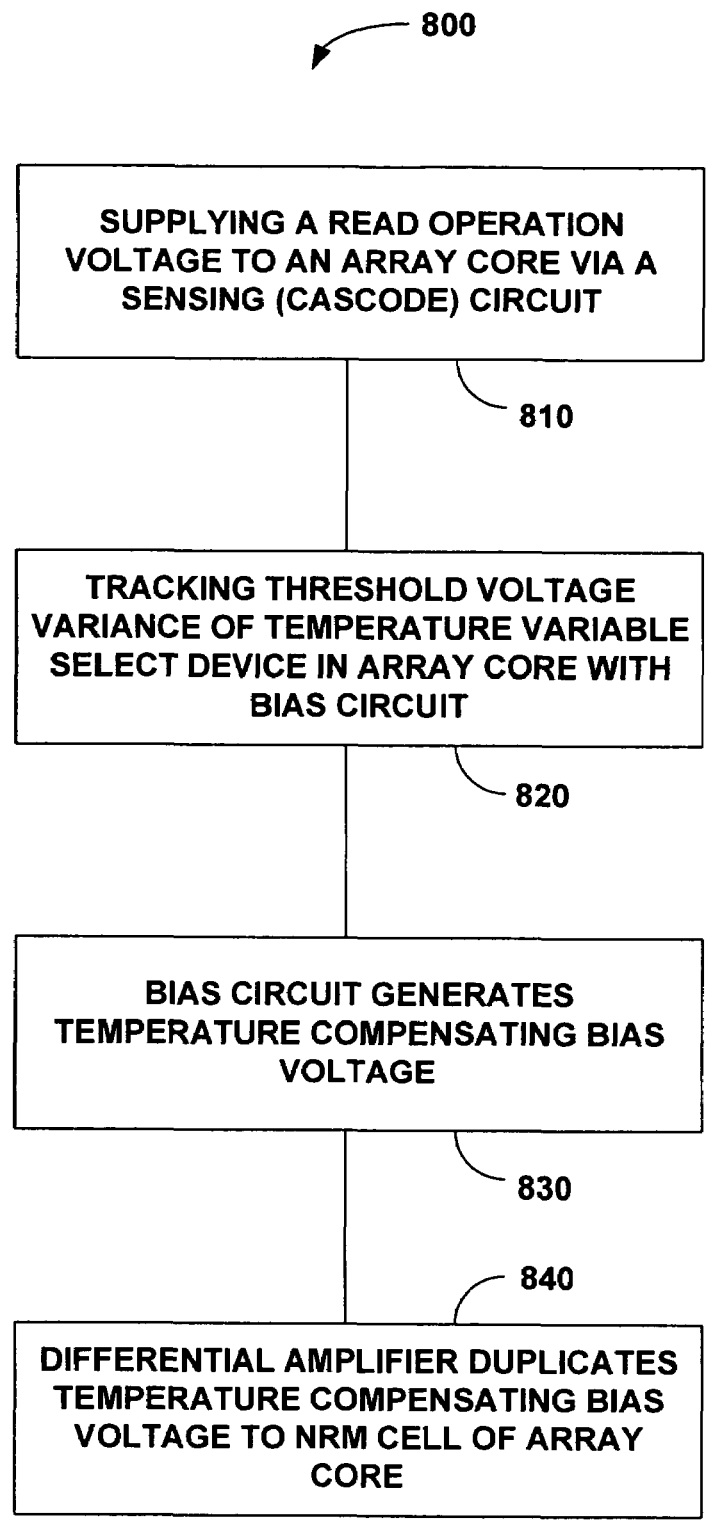
FIG. 8 illustrates a threshold voltage variance compensation method in accordance with one aspect of the subject invention.

In view of the exemplary systems shown and described above, a methodology, which may be implemented in accordance with the subject invention, will be better appreciated with reference to the flow diagram of FIG. 8. While, for purposes of simplicity of explanation, the methodology of FIG. 8 is shown and described as executing serially, it is to be understood and appreciated that the subject invention is not limited by the illustrated order, as some blocks may, in accordance with the subject invention, occur in different orders and/or concurrently with other blocks from that shown and described herein. Moreover, not all illustrated blocks may be required to implement a methodology in accordance with the subject invention.

FIG. 8 illustrates a threshold voltage variance compensation method 800 in accordance with one aspect of the subject invention. Method 800 utilizes a sensing (cascode) circuit to a supply an array core with a read voltage operation 810. The array core can include a temperature variable select device in series with a NRM cell, for example. As the read operation is executed on the array core, various process and/or temperature variations can occur, thereby changing the threshold voltage of the temperature variable select device. For instance, as ambient temperature increases, the device can experience a decrease in threshold voltage. Such a decrease can result in fluctuating read operation voltage levels reaching the NRM cell. As the temperature variable select device experiences fluctuations in threshold voltage, the fluctuations are tracked by a temperature variable select device of a temperature sensitive bias circuit 820. The temperature variable select device is the same type as the temperature variable select device of the array core, and can be in series with two resistors. One resistor has a positive temperature coefficient, the other resistor has a negative temperature coefficient. The resistive ratio of the two resistors is used to mimic the temperature effect on the NRM cell in the array core. To that end, the temperature sensitive bias circuit generates a temperature compensating bias reference voltage 830 in order to maintain a constant read operation voltage level within the NRM cell. A differential amplifier can be employed to duplicate the temperature compensating bias reference voltage 840 to the NRM cell.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A thin film diode voltage tracking system, comprising:
   an array core comprising a thin film diode in series with a nanoscale resistive memory cell, the nanoscale resistive memory cell having a controllably conductive media between a first electrode and a second electrode;
   a temperature sensitive bias circuit to generate a reference temperature compensating bias voltage during an array core operation; and
   a differential amplifier to supply the reference temperature compensating bias voltage to the nanoscale resistive memory cell.

2. The system of claim 1, wherein the array core operation comprises one of a read operation, an erase operation, and a program operation.

3. The system of claim 1, further comprising a sensing circuit to supply an array core operation voltage to the array core.

4. The system of claim 1, wherein the temperature sensitive bias circuit comprises a thin film diode in series with a first resistor and a second resistor.

5. The system of claim 4, wherein the thin film diode of the temperature sensitive bias circuit tracks a threshold voltage variance of the thin film diode of the array core.

6. The system of claim 5, wherein the threshold voltage variance comprises a decrease in a threshold voltage of the thin film diode of the array core as ambient temperature increases.

7. The system of claim 4, wherein the first resistor comprises a negative temperature coefficient and the second resistor comprises a positive temperature coefficient to create a resistive ratio to mimic temperature effects on the nanoscale resistive memory cell of the array core.

8. The system of claim 1, wherein the reference temperature compensating bias voltage effects a constant operation voltage on the nanoscale resistive memory cell of the array core.

9. A diode threshold voltage variance compensation method, comprising:
   utilizing a sensing circuit to supply a read operation voltage to an array core, the array core comprising a thin film diode in series with a nanoscale resistive memory cell, the nanoscale resistive memory cell having a controllably conductive media between a first electrode and a second electrode;
   tracking a threshold voltage variance of the thin film diode of the array core during a read operation of the array core;
   generating a temperature compensating bias voltage based on the threshold voltage variance by a temperature sensitive bias circuit; and
   applying the temperature compensating bias voltage to the nanoscale resistive memory cell of the array core to maintain a constant read operation voltage level across the nanoscale resistive memory cell.

10. The method of claim 9, wherein the threshold voltage variance comprises a decrease in voltage variance as ambient temperature increases.

11. The method of claim 9, wherein tracking a threshold voltage variance comprises utilizing a thin film diode in series with a first resistor and a second resistor to form the temperature sensitive bias circuit.

12. The method of claim 11, wherein the first resistor comprises a negative temperature coefficient and the second resistor comprises a positive temperature coefficient.

13. The method of claim 12, wherein the negative temperature coefficient and the positive temperature coefficient create a resistive ratio to mimic temperature effects experienced by the nanoscale resistive memory cell of the array core.

14. The method of claim 9, wherein applying the temperature compensating bias voltage to the nanoscale resistive memory cell comprises utilizing a differential amplifier.

15. A threshold voltage variance compensation system, comprising:
   means for utilizing a sensing circuit to supply a read operation voltage to an array core, the array core comprising a thin film diode in series with a nanoscale resistive memory cell, the nanoscale resistive memory cell having a controllably conductive media between a first electrode and a second electrode;
   means for tracking a threshold voltage variance of the thin film diode of the array core during a read operation of the array core;
   means for generating a temperature compensating bias voltage based on the threshold voltage variance by a temperature sensitive bias circuit; and
   means for applying the temperature compensating bias voltage to the nanoscale resistive memory cell of the array core for maintaining a constant read operation voltage level across the nanoscale resistive memory cell.

16. A memory cell operation voltage system, comprising:
   a sensing circuit to provide an operation voltage to a memory array, the memory array comprising at least one first temperature variable select device in series with a nanoscale resistive memory cell, the nanoscale resistive memory cell having a controllably conductive media between a first electrode and a second electrode;

a reference circuit to produce a reference temperature compensating bias voltage to maintain a constant operation voltage level within the nanoscale resistive memory cell; and a differential amplifier to duplicate the reference temperature compensating bias voltage to the nanoscale resistive memory cell of the memory array.

17. The system of claim 16, wherein the reference circuit comprises a first resistor having a negative temperature coefficient and a second resistor having a positive temperature coefficient to create a resistive ratio.

18. The system of claim 17, further comprising a second temperature variable select device to track threshold voltage fluctuation of the at least one first temperature variable select device of the memory array, the second temperature variable select device in series with the first resistor and the second resistor, the second temperature variable select device comprising the same type as the at least one first temperature variable select device of the memory array.

19. The system of claim 17, wherein the resistive ratio of the reference circuit comprises a capability to mimic the effect of temperature variations on the nanoscale resistive memory cell of the memory array.

20. The system of claim 18, the threshold voltage fluctuation comprises a decrease in threshold voltage as ambient temperature increases.

* * * * *